United States Patent
Takagi

(10) Patent No.: US 8,686,390 B2
(45) Date of Patent: Apr. 1, 2014

(54) NONVOLATILE MEMORY ELEMENT HAVING A VARIABLE RESISTANCE LAYER WHOSE RESISTANCE VALUE CHANGES ACCORDING TO AN APPLIED ELECTRIC SIGNAL

(75) Inventor: Takeshi Takagi, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/512,178

(22) PCT Filed: Nov. 18, 2010

(86) PCT No.: PCT/JP2010/006767
§ 371 (c)(1),
(2), (4) Date: May 25, 2012

(87) PCT Pub. No.: WO2011/064967
PCT Pub. Date: Jun. 3, 2011

(65) Prior Publication Data
US 2012/0280199 A1  Nov. 8, 2012

(30) Foreign Application Priority Data
Nov. 30, 2009  (JP) ............................ 2009-271373

(51) Int. Cl.
*H01L 47/00* (2006.01)
(52) U.S. Cl.
USPC ................. 257/3; 257/E45.002; 257/E45.003
(58) Field of Classification Search
USPC ................. 257/3–4, E45.002, E45.003
See application file for complete search history.

(56) References Cited

U.S. PATENT DOCUMENTS

| 6,753,561 | B1 * | 6/2004 | Rinerson et al. ............. 257/295 |
| 7,550,380 | B2 * | 6/2009 | Elkins et al. ................. 438/652 |
| 7,807,995 | B2 | 10/2010 | Mikawa et al. |
| 7,960,770 | B2 | 6/2011 | Mikawa et al. |
| 7,990,754 | B2 | 8/2011 | Azuma et al. |

(Continued)

FOREIGN PATENT DOCUMENTS

| JP | 2006-203098 | 8/2006 |
| JP | 2008-305889 | 12/2008 |

(Continued)

OTHER PUBLICATIONS

International Search Report issued Dec. 14, 2010 in International Application No. PCT/JP2010/006767.

(Continued)

*Primary Examiner* — David S Blum
(74) *Attorney, Agent, or Firm* — Wenderoth, Lind & Ponack, L.L.P.

(57) ABSTRACT

Provided is a nonvolatile memory element achieving a stable resistance change and miniaturization, and a method of manufacturing the same. The nonvolatile memory element includes: a first electrode formed above a substrate; an interlayer insulating layer formed above the substrate including the first electrode and having a memory cell hole reaching the first electrode; a barrier layer formed in the memory cell hole and composed of a semiconductor layer or an insulating layer connected to the first electrode; a second electrode formed in the memory cell hole and connected to the barrier layer; a variable resistance layer formed on the second electrode and having a stacked structure whose resistance value changes based on electric signals; and a third electrode connected to the variable resistance layer and formed on the interlayer insulating layer to cover the memory cell hole.

12 Claims, 8 Drawing Sheets

(56) References Cited

U.S. PATENT DOCUMENTS

| | | | |
|---|---|---|---|
| 8,022,502 B2 | 9/2011 | Kanzawa et al. | |
| 8,154,909 B2 | 4/2012 | Azuma et al. | |
| 2005/0029587 A1* | 2/2005 | Harshfield | 257/330 |
| 2006/0175597 A1* | 8/2006 | Happ | 257/2 |
| 2006/0175599 A1* | 8/2006 | Happ | 257/4 |
| 2008/0055973 A1* | 3/2008 | Reinberg et al. | 365/163 |
| 2009/0052225 A1 | 2/2009 | Morimoto | |
| 2009/0121212 A1* | 5/2009 | Zahorik | 257/4 |
| 2009/0230556 A1* | 9/2009 | Mikawa et al. | 257/758 |
| 2009/0283736 A1* | 11/2009 | Kanzawa et al. | 257/2 |
| 2010/0032641 A1 | 2/2010 | Mikawa et al. | |
| 2010/0051895 A1* | 3/2010 | Hampton | 257/4 |
| 2010/0090193 A1 | 4/2010 | Mikawa et al. | |
| 2010/0172171 A1* | 7/2010 | Azuma et al. | 365/148 |
| 2010/0187493 A1* | 7/2010 | Takahashi | 257/4 |
| 2010/0207094 A1 | 8/2010 | Kanzawa et al. | |
| 2010/0259966 A1* | 10/2010 | Kanzawa et al. | 365/148 |
| 2010/0314602 A1* | 12/2010 | Takano et al. | 257/4 |
| 2011/0249486 A1 | 10/2011 | Azuma et al. | |
| 2011/0294259 A1 | 12/2011 | Kanzawa et al. | |

FOREIGN PATENT DOCUMENTS

| | | |
|---|---|---|
| JP | 2009-163867 | 7/2009 |
| WO | 2008/013086 | 1/2008 |
| WO | 2008/047711 | 4/2008 |
| WO | 2008/062688 | 5/2008 |
| WO | 2008/149484 | 12/2008 |
| WO | 2008/149493 | 12/2008 |
| WO | 2009/050833 | 4/2009 |

OTHER PUBLICATIONS

Reply to Written Opinion issued Dec. 14, 2010 in International Application No. PCT/JP2010/006767 (with English translation).
Reply to Written Opinion issued Oct. 11, 2011 in International Application No. PCT/JP2010/006767 (with English translation).

* cited by examiner

NONVOLATILE MEMORY ELEMENT HAVING A VARIABLE RESISTANCE LAYER WHOSE RESISTANCE VALUE CHANGES ACCORDING TO AN APPLIED ELECTRIC SIGNAL

TECHNICAL FIELD

The present invention relates to a variable resistance nonvolatile memory element having a variable resistance element whose resistance value changes according to an applied electric signal, to a method of manufacturing the nonvolatile memory element, and to a nonvolatile memory device.

BACKGROUND ART

Recently, with advances in digital technology, electronic devices such as portable information devices and home information appliances have been developed to provide higher functionality. As the electronic devices have been developed to provide higher functionality, development of further miniaturized and higher-speed semiconductor elements is advancing at a high pace. Among them, the use of large-capacity nonvolatile memories which are typified by a flash memory has been expanding at a rapid pace. Furthermore, as next-generation new nonvolatile memories which have a potential to replace flash memory, research and development of what is known as a variable resistance nonvolatile memory device which uses a variable resistance element is advancing. As defined herein, the variable resistance element refers to an element which has a characteristic in which a resistance value changes reversibly in response to electric signals and is further able to store information corresponding to the resistance value in a nonvolatile manner.

As an example of a large-capacity nonvolatile memory device incorporating the above-described variable resistance elements, a crosspoint nonvolatile memory device has been proposed. For example, disclosed in Patent Literature (PTL) 1, as a memory unit, is a nonvolatile memory device having a configuration in which a variable resistance film and a diode element as a switching element are used.

Shown in FIG. 11A and FIG. 11B is a configuration of a nonvolatile memory device containing a conventional variable resistance element disclosed in PTL 1. FIG. 11A is a perspective view showing the configuration of the conventional nonvolatile memory device. Shown is the configuration of a crosspoint memory cell array 200 made of memory cells 280, each of which are formed at a crosspoint of a bit line 210 and a word line 220. FIG. 11B is a cross-sectional view showing the configuration of the memory cell provided in the conventional nonvolatile memory device. Shown is the configuration, taken along the direction of a bit line 210, of the memory cell 280, the bit line 210, and the word line 220.

As shown in FIG. 11A and FIG. 11B, a variable resistance element 260 includes a variable resistance layer 230 for storing information according to a change in electric resistance in response to electric stress applied thereto, and an upper electrode 240 and a lower electrode 250 placed on either side of the variable resistance layer 230. Formed on the variable resistance element 260 is a two-terminal nonlinear element 270 having a nonlinear current-voltage characteristic for flowing a current bidirectionally. The memory cell 280 is formed of a series circuit including the variable resistance element 260 and the nonlinear element 270. The nonlinear element 270 is a two-terminal element having a nonlinear current-voltage characteristic similar to that of a diode in which a current changes inconstantly with respect to a voltage change. Moreover, the bit line 210 serving as an upper line is connected electrically to the nonlinear element 270, and the word line 220 serving as a lower line is electrically connected to the lower electrode 250 of the variable resistance element 260. Because current flows bidirectionally when rewriting the memory cell 280, a varistor (ZnO or $SrTiO_3$) having a current-voltage characteristic which is bidirectionally symmetric and nonlinear is used as the nonlinear element 270. With the above configuration, it is possible to flow a current with a current density of 30 $kA/cm^2$ or higher which is required for rewriting for the variable resistance element 260.

CITATION LIST

Patent Literature

[PTL 1] Japanese Unexamined Patent Application Publication No. 2006-203098.

SUMMARY OF INVENTION

Technical Problem

In order to manufacture the conventional nonvolatile memory device described above, it is necessary to pattern the upper electrode 240, the variable resistance layer 230, the lower electrode 250, and the nonlinear element 270 at the same time in the direction of the bit line 210 when the bit line 210 is processed, and in the direction of the word line 220 when the word line is processed, and is necessary to form the memory cell 280 only at the crosspoint of the word line 220 and the bit line 210.

However, patterning by etching is difficult with this method of manufacturing because the layers to be patterned become thicker, and because a plurality of element patterns of stacked element films made from different materials must be formed at the same time. Consequently, a problem arises in that miniaturization of the conventional nonvolatile memory device is limited.

Accordingly, the object of the present invention is to solve the problems associated with the conventional configuration by providing a nonvolatile memory element, a nonvolatile memory device, and a method of manufacturing the nonvolatile memory element which can stably perform a resistance changing operation and are suitable for miniaturization.

Solution to Problem

To solve the problems described above, an embodiment of the nonvolatile memory element according to the present invention comprises a first electrode formed above a substrate, an interlayer insulating layer formed on the first electrode and provided with a memory cell hole that reaches the first electrode, a barrier layer formed inside the memory cell hole and connected to the first electrode, the barrier layer being a semiconductor layer or an insulating layer, a second electrode formed inside the memory cell hole and connected to the barrier layer, a variable resistance layer formed on the second electrode and having a stacked structure including a first oxide layer and a second oxide layer having an oxygen content atomic percentage that is higher than an oxygen content atomic percentage of the first oxide layer, and a third electrode formed on the interlayer insulating layer and connected to the variable resistance layer, wherein a resistance state of the variable resistance layer changes to a different resistance state based on an electric signal applied between the second electrode and the third electrode, and the barrier layer forms a Schottky barrier junction with at least one of the first electrode and the second electrode.

In this embodiment, the barrier layer may be formed on at least an entire bottom portion of said memory cell hole, and may be further formed on at least a portion of a side wall of the memory cell hole.

Moreover, in this embodiment, it is preferable that the variable resistance layer comprise tantalum oxide or hafnium oxide.

Moreover, in this embodiment, at least a portion of the variable resistance layer may be formed inside the memory cell hole.

Moreover, in this embodiment, the first oxide layer may be formed inside the memory cell hole.

Moreover, in this embodiment, the second oxide layer may be formed outside the memory cell hole.

Moreover, in this embodiment, the first oxide layer may comprise tantalum oxide having a composition expressed as $TaO_x$ (where $0.8 \leq x \leq 1.9$), and the second oxide layer may comprise tantalum oxide having a composition expressed as $TaO_y$ (where $2.1 \leq y$).

Moreover, in this embodiment, the semiconductor layer may be a silicon nitride layer.

Moreover, in this embodiment, the second electrode may comprise tantalum nitride or tungsten.

Moreover, in this embodiment, the memory cell hole may be formed penetrating through the interlayer insulating layer to inside of the first electrode.

Moreover, in this embodiment, the third electrode may be formed outside the memory cell hole.

Moreover, an embodiment of the nonvolatile memory device according to the present invention is provided with the nonvolatile memory element according to the above-described embodiment, and comprises a plurality of first electrode lines formed parallel to each other above the substrate, a plurality of second electrode lines formed above the first electrode lines so as to (i) be parallel to each other in a plane parallel with a major surface of the substrate and (ii) three-dimensionally cross the first electrode lines, and a plurality of the nonvolatile memory elements provided at positions which correspond to the three-dimensional crosspoints of the first electrode lines and the second electrode lines.

Moreover, a method of manufacturing a nonvolatile memory element according to the present invention including a variable resistance layer whose resistance state changes to a different resistance state based on an electric signal applied between a second electrode and a third electrode which are disposed below and above the variable resistance layer, respectively, the method comprising forming a first electrode above a substrate, forming an interlayer insulating layer on the first electrode above the substrate, forming a memory cell hole in the interlayer insulating layer that reaches the first electrode, forming a barrier layer inside the memory cell hole so as to be connected to the first electrode, the barrier layer being a semiconductor layer or an insulating layer, forming the second electrode inside the memory cell hole in such a way that the second electrode is embedded therein and connected to the barrier layer, forming, on the second electrode, the variable resistance layer having a stacked structure including a first oxide layer and a second oxide layer having an oxygen content atomic percentage that is higher than an oxygen content atomic percentage of the first oxide layer, and forming the third electrode on the interlayer insulating layer so as to cover the memory cell hole, the third electrode being connected to the variable resistance layer.

In the forming of a barrier layer according to this embodiment, the barrier layer may be formed on at least a portion of a bottom and a side wall of the memory cell hole.

Moreover, in the forming of a variable resistance layer according to this embodiment, the variable resistance layer may be embedded in the memory cell hole.

Advantageous Effects of Invention

With the present invention, a nonvolatile memory element, a nonvolatile memory device, and a method of manufacturing the nonvolatile memory element can be realized which can stably perform a resistance changing operation and which can be miniaturized.

DESCRIPTION OF EMBODIMENTS

Figure 1:
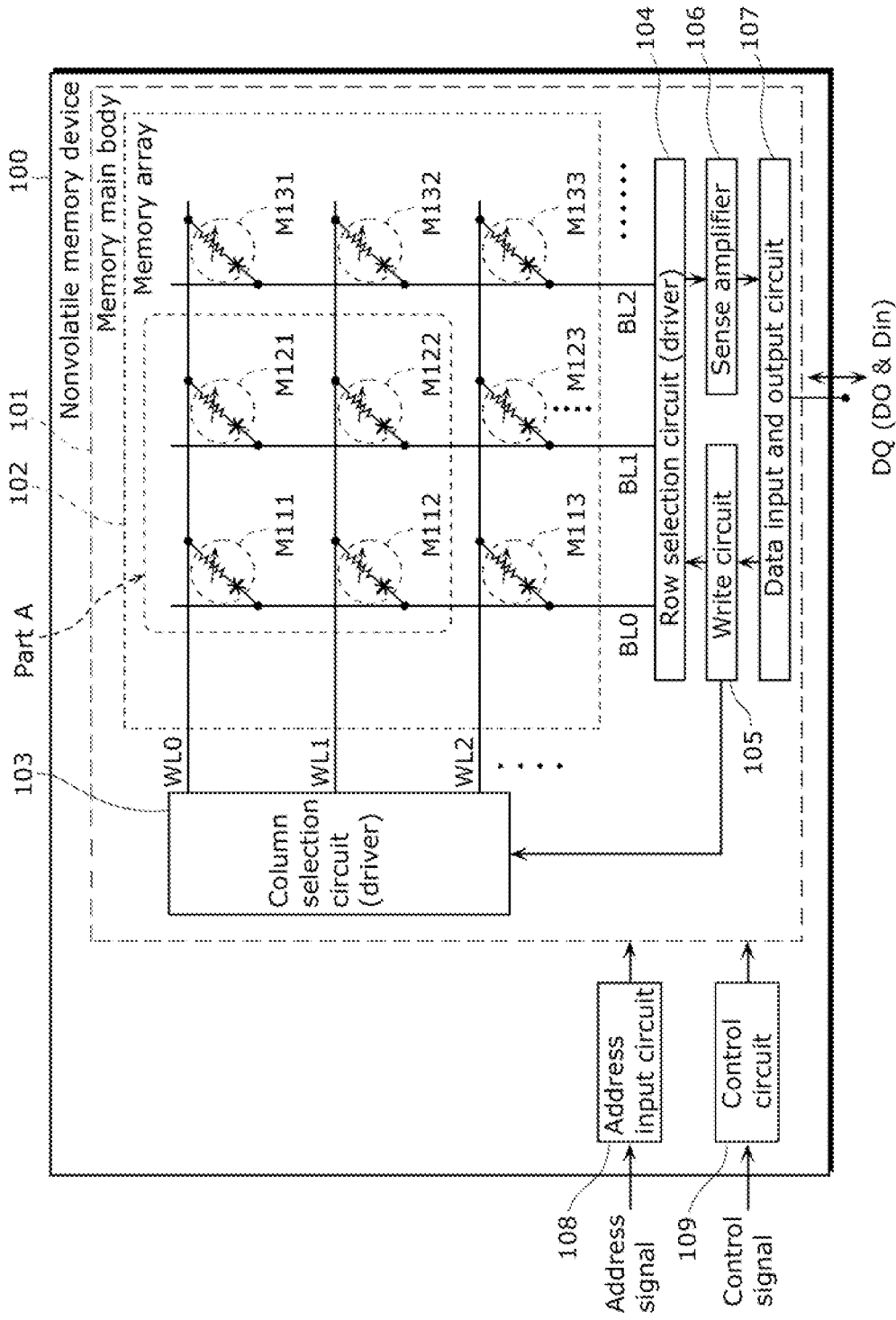
FIG. 1 is a block view showing a configuration of a nonvolatile memory device according to an embodiment of the present invention.

Hereinafter, preferred embodiments of the present invention will be described with reference to the drawings. It is to be noted that descriptions of constituents having the same reference numerals used in each of the drawings are omitted in some cases. In addition, in the drawings, the constituents are schematically depicted for easier understanding. Therefore, the shapes and scales of the constituents are not depicted correctly in some cases.

(First Embodiment)

The nonvolatile memory device according to the first embodiment of the present invention is a crosspoint nonvolatile memory device including: the nonvolatile memory element which is (i) provided with the variable resistance layer positioned at a crosspoint (three-dimensional crosspoint) of the word line and the bit line, and (ii) whose resistance changes to a plurality of different resistance values based on electric signals applied between the upper electrode and the lower electrode, which are deposited above and below the variable resistance layer between the word line and the bit line; and the nonlinear element that is connected in series to the nonvolatile memory element and which applies a predetermined read or write electric signal to a selected nonvolatile memory element only. The resistance value of the nonvolatile memory element changes according to the amplitude, pulse width, or polarity (positive or negative) of the applied electric signal, and the resistance value is maintained even after application of the electric pulse is stopped. Such a nonvolatile memory element can be used as ReRAM (Resistive RAM), PCRAM (Phase Change RAM), MRAM (Magnetic RAM), or CBRAM (Conductive Bridge RAM), for example. Unipolar (or monopolar) is when only one polarity of an electric signal is used to induce resistance change, and bipolar is when both positive and negative polarities are used. Types of unipolar nonvolatile memory elements include ReRAM and PCRAM, for example, and types of bipolar nonvolatile memory elements include ReRAM, MRAM, and CBRAM, for example. When the nonvolatile memory element is ReRAM, the unipolar variable resistance layer can comprise nickel oxide, titanium oxide, or niobium oxide, for example. The bipolar variable resistance layer can comprise tantalum oxide, hafnium oxide, or zirconium oxide, for example.

When the nonvolatile memory element has two resistance states, a high resistance state and a low resistance state, the nonvolatile memory element has a first threshold voltage $V_{th1}$ and a second threshold voltage $V_{th2}$. When a voltage having an absolute value greater than the two threshold voltages is applied, the resistance state changes to a different resistance state, that is, changes from a high resistance state to a low resistance state, or from a low resistance state to a high resistance state.

Moreover, a nonlinear element has a single direction or dual direction diode characteristic. Like a typical diode characteristic, When the threshold voltage of the nonlinear element is VF, if VF is positive, the state of a single direction nonlinear element is ON under application of a voltage greater than VF, and OFF under application of a voltage less than VF. If VF is negative, the correlation is reversed. A dual direction nonlinear element has threshold voltages VF1 and VF2 for each of positive and negative application voltages. When the absolute value of the voltage applied to the nonlinear element is between the threshold voltages VF1 and VF2, the state of the nonlinear element changes to OFF, and current cannot flow. On the other hand, when the absolute value of the applied voltage is greater than VF1 or VF2, the state of the nonlinear element changes to ON, and a current required for writing or reading can be applied to the nonvolatile memory element. Usually, a single direction nonlinear element is used with a unipolar nonvolatile memory element, and a dual direction nonlinear element is used with a bipolar nonvolatile memory element.

[Nonvolatile Memory Device Configuration]

Figure 2:
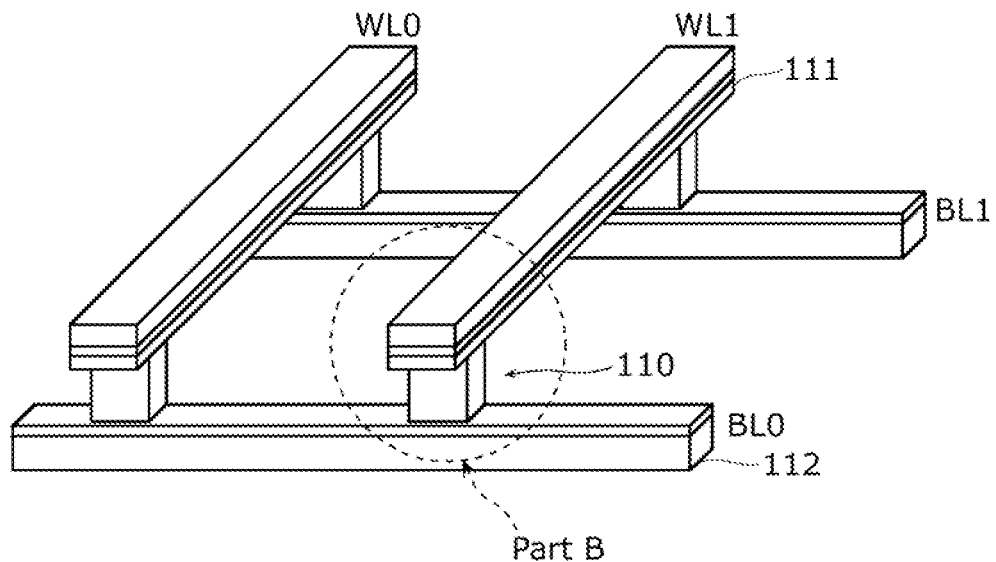
FIG. 2 is a perspective view showing the configuration (4 bit configuration) of Part A shown in FIG. 1.

Next, the nonvolatile memory device according to the first embodiment of the present invention will be explained with reference to FIG. 1 and FIG. 2. FIG. 1 is a block view showing a configuration of a nonvolatile memory device according to the first embodiment of the present invention. FIG. 2 is a perspective view showing the configuration (4 bit configuration) of Part A of the nonvolatile memory device shown in FIG. 1.

As shown in FIG. 1, a nonvolatile memory device 100 according to the first embodiment of the present invention includes a memory main body 101 provided above a semiconductor substrate. The memory main body 101 includes a memory cell array 102, a row selection circuit (driver) 103, a column selection circuit (driver) 104, a write circuit 105 for writing information, a sense amplifier 106 which detects an amount of current flowing in a selected bit line and determines whether the data indicates "1" or "0", and a data input and output circuit 107 which performs an input and output process of input and output data via a DQ terminal.

Moreover, the nonvolatile memory device 100 includes an address input circuit 108 which receives an address signal input from an external source, and a control circuit 109 which controls operation of the memory main body 101 based on a control signal input from an external source.

As shown in FIG. 1 and FIG. 2, the memory cell array 102 includes (i) a plurality of word lines WL0, WL1, WL2 . . . formed parallel to each other above the semiconductor substrate, and (ii) a plurality of bit lines BL0, BL1, BL2 . . . formed parallel to each other above the word lines WL0, WL1, WL2 . . . in a plane parallel with a major surface of the substrate so as to three-dimensionally cross the word lines WL0, WL1, WL2 . . . .

Moreover, the memory cell array 102 includes, arranged in a matrix, a plurality of memory cells (nonvolatile memory elements) M111, M112, M113, M121, M122, M123, M131, M132, M133 . . . (hereinafter referred to as memory cells M111, M112 . . . ) each of which are deposited to a corresponding crosspoint of the word lines WL0, WL1, WL2 . . . and bit lines BL0, BL1, BL2 . . . .

It is to be noted that, the memory cell M112 of the memory cells M111, M122 . . . depicted in FIG. 1 is labeled with the reference numeral 110 in FIG. 2. Details with respect to the configuration of the memory cell 110 will be described later.

The address input circuit 108 receives an address signal from an external circuit (not shown in the drawings), and, based on this address signal, simultaneously outputs a row address signal to the row selection circuit (driver) 103 and a column address to the column selection circuit (driver) 104. Here, the address signal is a signal indicating an address of a specific memory cell to be selected from among the plurality of memory cells M111, M112 . . . . Moreover, the row address signal is a signal indicating an address of a row which is part of the address indicated by the address signal, and the column address is a signal which is part of the address indicated by the address signal.

In a data write cycle, the control circuit 109 outputs, to the write circuit 105, a write command signal instructing application of a voltage for writing, according to input data Din input into the data input and output circuit 107. On the other hand, in a data read cycle, the control circuit 109 outputs, to the column selection circuit (driver) 104, a read command signal instructing a read operation.

The row selection circuit (driver) 103 receives the row address signal output from the address input circuit 108, selects one of the word lines WL0, WL1, WL2 . . . according to the row address signal, and applies a predetermined voltage to the selected word line.

The column selection circuit (driver) 104 receives the column address signal output from the address input circuit 108, selects one of the bit lines BL0, BL1, BL2 . . . according to the column address signal, and applies a voltage for writing or a voltage for reading to the selected bit line. At this time, a voltage half (or near half) that of the voltage for writing or voltage for reading is applied to the unselected bit lines, or the unselected bit lines are brought to a floating state.

When the write circuit 105 receives the write command signal output from the control circuit 109, the write circuit 105 outputs, to the row selection circuit (driver) 103, a signal instructing the application of voltage to the selected word line, and outputs, to the column selection circuit (driver) 104, a signal instructing the application of the voltage for writing to the selected bit line.

Moreover, in the data read cycle, the sense amplifier 106 detects an amount of current flowing in the selected bit line to be read, and determines whether the data indicates "1" or "0". The resultant output data DO is output to the external circuit via the data input and output circuit 107.

It is to be noted that, by three-dimensionally stacking the memory cell array 102 in the nonvolatile memory device 100 according to the first embodiment and shown in FIG. 1 and FIG. 2, it is also possible to implement a nonvolatile memory device having a multi-layered structure of a plurality of memory array layers. By utilizing a multi-layered memory cell array configured in such a way, it is possible to implement ultra large-capacity nonvolatile memory device.

Moreover, in FIG. 1, a dual direction nonlinear element is used as the nonlinear element, but a single direction nonlinear element may be used when the nonvolatile memory element is a unipolar nonvolatile memory element.

[Memory Cell Configuration]

Figure 3:
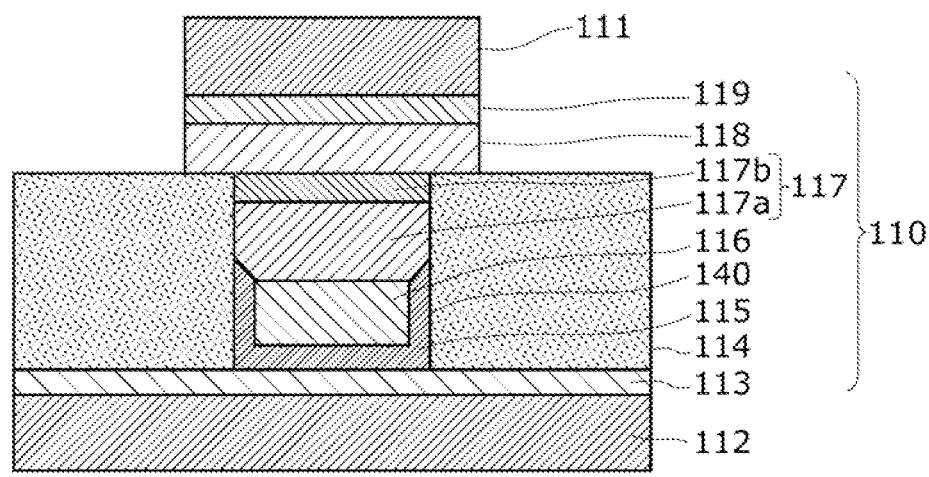
FIG. 3 is a cross-sectional view showing a configuration of a memory cell included in a nonvolatile memory device according to the first embodiment of the present invention.

Next, the nonvolatile memory element (memory cell) according to the first embodiment of the present invention will be explained with reference to FIG. 3. FIG. 3 is a cross-sectional view showing a configuration of the memory cell included in the nonvolatile memory device according to the first embodiment of the present invention. It is to be noted that in FIG. 3, the configuration of Part B of the nonvolatile memory device in FIG. 2 is shown As shown in FIG. 3, the memory cell (nonvolatile memory element) 100 included in the nonvolatile memory device 100 according to the first embodiment of the present invention is formed between a lower line 112 (which corresponds to the word line WL1 in FIG. 1) that is a copper line and an upper line 111 (which corresponds to the bit line BL1 in FIG. 1) that is also a copper line. The upper line 111 and the lower line 112 are arranged orthogonally to each other and in a direction perpendicular to the surface of a substrate 130.

The memory cell 110 is a memory cell hole nonvolatile memory element, and includes: a first electrode 113 formed above the semiconductor substrate (not shown in the drawings); an interlayer insulating layer 114 made of a silicon oxide film ($SiO_2$) formed to cover the first electrode 113 and having a memory cell hole 140 formed therein reaching the first electrode 113; a barrier layer 115, a second electrode 116, and a variable resistance layer 117 formed inside the memory cell hole 140; and a third electrode 118 formed above the second electrode 116 and connected to the variable resistance layer 117. It is to be noted that the interlayer insulating layer 114 is formed on the first electrode 113 which is formed above the semiconductor substrate.

The first electrode 113 is formed on the lower line 112 so as to be connected thereto. Moreover, the barrier layer 115 is formed between the first electrode 113 and the second electrode 116 inside the memory cell hole 140 so as to be connected to the first electrode 113 and the second electrode 116, and formed such that a Schottky barrier forms at the junction of at least one of the first electrode 113 and the second electrode 116. The variable resistance layer 117 has a stacked structure of a first variable resistance layer 117a and a second variable resistance layer 177b, and is formed on the second electrode 116 inside the memory cell hole 140.

The third electrode 118 is formed outside the memory cell hole 140. The third electrode 118 along with a blocking layer 119 formed thereon constitutes an upper electrode which is connected to the upper line 111. The upper electrode is formed above the interlayer insulating layer 114 so as to cover the memory cell hole 140 formed in the interlayer insulating layer 114. As a result of the third electrode 118 being formed outside the memory cell hole 140 in the first embodiment, the upper electrode can be integrally formed in the line forming process, thereby simplifying the manufacturing process.

Here, the barrier layer 115 is formed on the bottom surface and the side walls of the memory cell hole 140, but forming the barrier layer 115, at the least, on the entire bottom surface of the memory cell hole 140 in order to form the nonlinear element is acceptable. That is, according to the first embodiment, it is acceptable to form the barrier layer 115 inside the memory cell hole 140 on the entire surface of the first electrode 113 which constitutes the bottom surface of the memory cell hole 140.

In the first embodiment, the first electrode 113, the second electrode 116, and the blocking layer 119 included in the upper electrode comprise tantalum nitride (TaN). Moreover, the third electrode 118 included in the upper electrode comprises platinum (Pt). However, the materials used for the first electrode 113, the second electrode 116, the third electrode 118, and the blocking layer 119 are not limited thereby. For example, the third electrode 118 may comprise iridium (Ir), palladium (Pd), or a composite thereof. The second electrode 116 may comprise tungsten (W). Moreover, the blocking layer 119 may comprise tantalum (Ta), titanium (Ti), titanium nitride (TiN), or ruthenium (Ru). It is to be noted that in, for example, FIG. 3, the blocking layer 119 is only formed on the bottom portion of the upper line 111 which is a copper line. However, when a damascene structure is used, the blocking layer 119 is also formed on a side wall of the upper line 111.

Moreover, in the first embodiment, the barrier layer 115 is a semiconductor layer comprising silicon nitride ($SiN_z$). When both the first electrode 113 and the second electrode 116 comprise TaN, the interface between the first electrode 113 and the barrier layer 115 as well as the interface between the second electrode 116 and the barrier layer 115 function as a Schottky barrier, and as a result, the nonvolatile memory element functions as a dual direction nonlinear element. In other words, when a voltage having a value that is between a positive threshold voltage VF+ and a negative threshold voltage VF− is applied between the first electrode 113 and the second electrode 116, current does not flow between the first electrode 113 and the second electrode 116. When a voltage having an absolute value greater than the two threshold voltages is applied, current flows between the first electrode 113 and the second electrode 116.

Moreover, the properties of the silicon nitride ($SiN_z$) vary depending on the composition of the nitrogen expressed as z. When the value of z is low, the silicon nitride behaves as a semiconductor, and when the value of z is high, the silicon nitride behaves as an insulator. Compared to when having the properties of an insulator, the silicon nitride having the properties of a semiconductor can obtain a large current. When the composition of the nitrogen expressed as z in $SiN_z$ satisfies $0<z\leq0.85$, a current density of 10000 A/cm$^2$ can be obtained. When the $SiN_z$ includes nitrogen that satisfies this composition, it can be estimated that the $SiN_z$ will have an increased resistance to breakdown when a large current flows.

A material may be used for the first electrode 113 and the second electrode 116 which allows the interfaces of the first electrode 113 and the second electrode 116 with the silicon nitride ($SiN_z$) to function as a Schottky barrier. Furthermore, when the first electrode 113 and the second electrode 116 comprise a material having a different work function, a dual direction nonlinear element having an asymmetrical characteristic with respect to the positive bias region and the negative bias region can be implemented. Moreover, when the use of a single direction nonlinear element is preferred (when the nonvolatile memory element is a unipolar nonvolatile memory element), the configuration thereof may be such that only one of the first electrode 113 and the second electrode 116 forms a Schottky barrier at the interface with the barrier layer 115. In this case, TaN, which is stable against the heat that is generated by the current that flows at the time the resistance of variable resistance element changes, can be used as the material for the first electrode 113 or the second electrode 116. It is to be noted that the first electrode 113 or the second electrode 116 may comprise a material other than TaN, such as α-tungsten (W) which has a body-centered cubic (bcc) structure, or titanium nitride (TiN). By using a refractory metal or a metal-nitride-oxide as the electrode material for the nonlinear element, it can be estimated that resistance to breakdown will increase when a large current flows.

When a nonlinear element as described above is used with a crosspoint memory cell, key points include the use of configurations and materials which can endure the current flowing at the time of writing, and the adjustment of the threshold voltage VF. As previously described, materials which can endure the flow of a large current include, for the electrode, TaN, W, and TiN, and for the semiconductor layer, $SiN_z$. When the write voltage applied to the memory cell is VP, and the read voltage is VR, it is necessary to adjust the threshold voltage VF so as to satisfy the relationship: VP>VR>VF>VP/2. Here, VP/2 is a voltage applied to the unselected bit lines or word lines.

While the value of VF varies depending on the material, thickness, and composition of the variable resistance layer, the value can be adjusted by changing the electrode material, the nitrogen atom content of the $SiN_z$, and the film thickness.

In the first embodiment, the barrier layer 115 is formed on the bottom and side walls of the memory cell hole 140 (approximate diameter of 50 to 500 nm) formed in the interlayer insulating layer 114, and the portion formed on the bottom is in contact with the first electrode 113. The second electrode 116 and the variable resistance layer 117 are stacked in that order and deposited inside the memory cell hole 140 wherein the barrier layer 115 is formed in the manner described above.

Moreover, as described above, because the barrier layer 115 is configured to be a semiconductor layer, the stacked structure of the region of the first electrode 113 in contact with the barrier layer 115, the barrier layer 115, and the second electrode 116 functions as a MSM (metal-semiconductor-metal) diode. It is to be noted that the present invention is not limited to this configuration. For example, the barrier layer 115 can be configured to be an insulating layer so the stacked structure of the region of the first electrode 113 in contact with the barrier layer 115, the barrier layer 115, and the second electrode 116 functions as a MIM (metal-insulator-metal) diode. In this case, $SiO_2$, $Si_3N_4$, $Ta_2O_5$, for example, can be used in the barrier layer 115 configured to be an insulator.

The variable resistance layer 117 has a stacked structure including the first variable resistance layer 117a and the second variable resistance layer 117b having an oxygen content atomic percentage that is higher than an oxygen content atomic percentage of the first variable resistance layer 117a. In the first embodiment, the first variable resistance layer and the second variable resistance layer will be described comprising an oxygen-deficient transition metal oxide. It is to be noted that an oxygen-deficient transition metal oxide is an oxide whose oxygen content (atomic ratio: ratio of number of oxygen atoms to total number of atoms) is less than an oxide having a stoichiometric composition. Oxides having a stoichiometric composition are usually insulators, or have an extremely high resistance value. For example, the oxide of the transition metal has a stoichiometric composition of $Ta_2O_5$, and the ratio of Ta atoms to O atoms (O/Ta) is 2.5. Therefore, in an oxygen-deficient Ta oxide, the ratio of Ta to O is greater than 0 and less than 2.5.

In the first embodiment, it is preferable that the oxygen-deficient transition metal oxide is an oxygen-deficient tantalum oxide. Further preferable is that the variable resistance layer 117 at least have a stacked structure including the first variable resistance layer (first tantalum oxide layer) 117a having a composition represented as $TaO_x$ (where $0<x<2.5$), and the second variable resistance layer (second tantalum oxide layer) 117b having a composition represented as $TaO_y$ (where x<y). Here, to realize a stably operating variable resistance element, it is preferable that the $TaO_x$ be adjusted to satisfy the relationship $0.8\leq x\leq1.9$, and the $TaO_y$ be adjusted to satisfy the relationship $2.1\leq y\leq2.5$.

Consequently, by making the oxygen content atomic percentage of the second variable resistance layer 117b higher than the oxygen content atomic percentage of the first variable resistance layer 117a, a resistance changing phenomenon in response to oxidation and reduction can occur more easily at the interface between the upper electrode (here the third electrode 118) and the second variable resistance layer 117b. Therefore, because a resistance changing phenomenon can occur more easily, a memory cell capable of low voltage programming by applying a voltage between the upper and lower electrodes that is lower than approximately 1.5 to 2.0 V can be achieved.

Moreover, by forming the second variable resistance layer 117b to have a film thickness that is thinner than the first variable resistance layer 117a, a high-speed, stable, reversible rewrite characteristic and a favorable resistance value retention characteristic can be realized. Details regarding relevant knowledge gained from test results can be found in patent literature WO 2008/149484, and are therefore omitted here.

It is to be noted that, as previously described, in the first embodiment, the second electrode 116 comprises tantalum nitride (TaN), and the third electrode 118 included in the upper electrode comprises platinum (Pt). Here, when the standard electrode potential of platinum is V2, V2 is 1.188 eV, and when the standard electrode potential of tantalum nitride is V1, V1 is 0.48 eV. Standard electrode potential is generally used as one indicator of oxidizability. The higher the value, the less oxidizable a material is, and the lower the value, the more oxidizable a material is. The greater the difference between the standard electrode potential of the electrode and the variable resistance layer, the more easily a change in resistance can occur. As the difference becomes smaller, the more difficult it is for a change in resistance to occur. Accordingly, it can be inferred that a high tendency to oxidize will play a large role in a mechanism of the resistance changing phenomenon. When the standard electrode potential of tantalum (Ta) is Vt, Vt is −0.6 eV, and the relationship Vt<V2 is satisfied. Accordingly, oxidation and reduction of the tantalum oxide occur at the second variable resistance layer 117b in the vicinity of the interface between the third electrode 118 (upper electrode) comprising platinum and the second variable resistance layer 117b, the transfer of oxygen occurs, and a resistance changing phenomenon occurs. Moreover, as the relationship V2>V1 is satisfied, the oxidation-reduction reaction occurs preferentially at the interface between the third electrode 118 comprising platinum and the second variable resistance layer 117b to the interface between the second electrode 116 comprising tantalum nitride and the first variable resistance layer 117a. As a result, the resistance changing phenomenon can be made to occur at only one of the electrode-variable resistance layer interfaces, thereby preventing a malfunction arising from the resistance changing phenomenon occurring at the other interface. Details regarding relevant knowledge gained from test results can be found in patent literature WO 2009/050833, and are therefore omitted here.

With the nonvolatile memory element according to the first embodiment of the present invention as described above, the memory cell can be miniaturized due to the barrier layer 115, the second electrode 116, and the variable resistance layer 117 being formed inside the memory cell hole 140 formed in the interlayer insulating layer 114. As a result, a variable resistance nonvolatile memory device suitable for large-capacity storage and high integration can be implemented.

Method of manufacturing the nonvolatile memory element] Next, the method of manufacturing the nonvolatile memory element according to the first embodiment of the present invention as described above will be explained with reference to FIG. 4A through FIG. 4H.

FIG. 4A through FIG. 4H are cross-sectional views showing a manufacturing process of a main component of the nonvolatile memory element according to the first embodiment of the present invention.

Figure 4A:
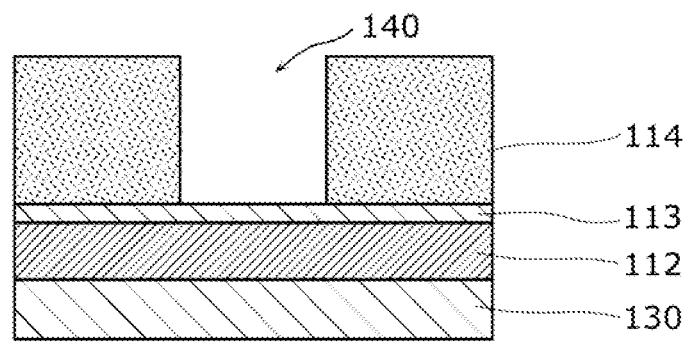
FIG. 4A is a cross-sectional view showing a manufacturing process of a main component (the interlayer insulating layer forming process and the memory cell hole forming process) of the nonvolatile memory device according to the first embodiment of the present invention.

First, as shown in FIG. 4A, the lower line 112, which is a copper line, is formed above the substrate 130 which is a semiconductor substrate such as a silicon substrate using a desired mask. Furthermore, the first electrode 113, which is a tantalum nitride layer, is formed on the lower line 112 using a desired mask. Afterward, the interlayer insulating layer 114 made of a silicon oxide film with a film thickness of approximately 150 to 500 nm is formed above the entire surface of the substrate 130 including the first electrode 113, then the memory cell hole (opening) 140 having a diameter of approximately 50 to 300 nm is formed penetrating through the interlayer insulating layer 114 and connecting to the first electrode 113.

Figure 4B:
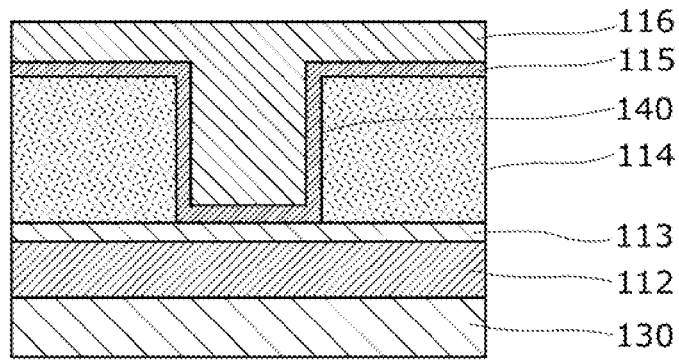
FIG. 4B is a cross-sectional view showing a manufacturing process of a main component (the barrier layer forming process and the second electrode forming process) of the nonvolatile memory device according to the first embodiment of the present invention.

Next, as shown in FIG. 4B, silicon nitride is deposited by atomic layer deposition (ALD) and the barrier layer 115 made of the silicon nitride layer (when expressed as $SiN_z$, z=0.3) having a film thickness of approximately 5 to 25 nm is formed inside the memory cell hole 140 on the entire bottom surface (the surface of the first electrode 113) and covering all of the side walls therein, as well as on the interlayer insulating layer 114. Furthermore, tantalum nitride is deposited by ALD, whereby a tantalum nitride layer is embedded in the memory cell hole 140, and the second electrode 116 made of tantalum nitride is formed on the barrier layer 115. Thus, the barrier layer (silicon nitride layer) 115 and the second electrode (tantalum nitride layer)116 are embedded in the memory cell hole 140 formed in the interlayer insulating layer 114.

Figure 4C:
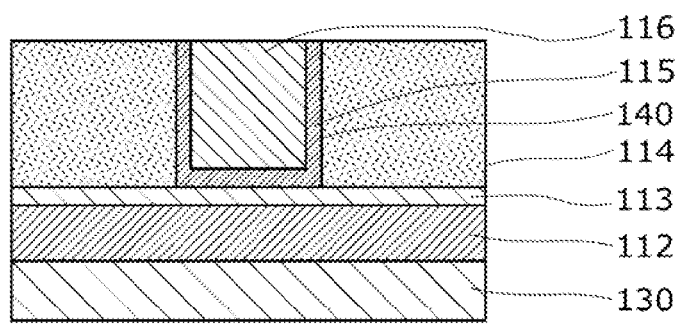
FIG. 4C is a cross-sectional view showing a manufacturing process of a main component (the second electrode planarization process) of the nonvolatile memory device according to the first embodiment of the present invention.

Next, as shown in FIG. 4C, a planarization process by chemical-mechanical polishing (CMP) is performed, removing a portion of the barrier layer (silicon nitride layer) 115 and the second electrode (tantalum nitride layer) 116 until the interlayer insulating layer 114 is exposed.

Figure 4D:
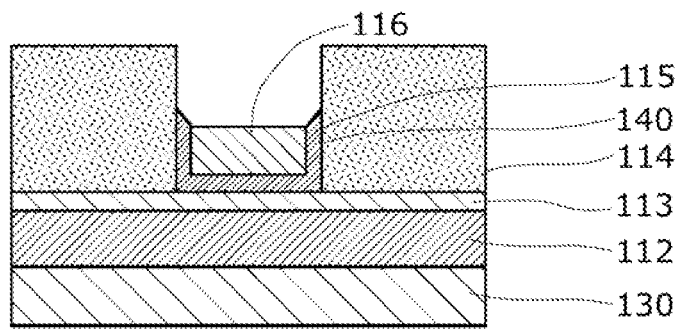
FIG. 4D is a cross-sectional view showing a manufacturing process of a main component (the barrier layer and the second electrode etch back process) of the nonvolatile memory device according to the first embodiment of the present invention.

Next, as shown in FIG. 4D, a portion of the upper layer of the second electrode (tantalum nitride layer) 116 inside the memory cell hole 140 is removed by etch back. In the first embodiment, removal is carried out until the second electrode 116 has a thickness of approximately 50 nm. Moreover, a portion of the barrier layer (silicon nitride layer) 115 which had formed on the walls of the memory cell hole 140 formed in the interlayer insulating layer 114 is also removed in the etch back process performed on the second electrode 116.

Figure 4E:
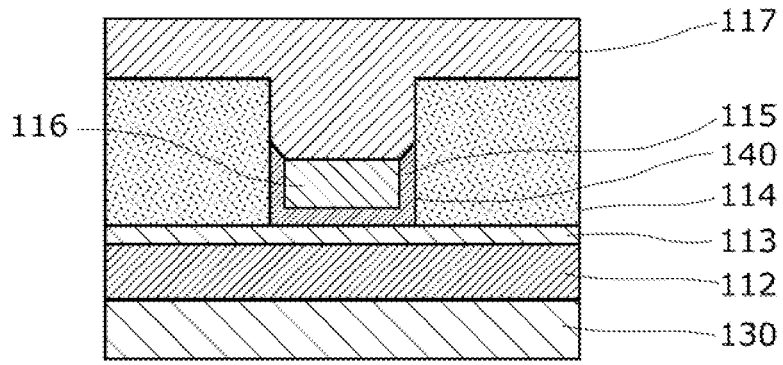
FIG. 4E is a cross-sectional view showing a manufacturing process of a main component (the first variable resistance layer forming process) of the nonvolatile memory. device according to the first embodiment of the present invention.

Next, as shown in FIG. 4E, a layer of tantalum oxide is deposited so as to fill the memory cell hole 140 in the interlayer insulating layer 114 by reactive sputtering in which a tantalum target is sputtered in a mixed gas atmosphere of argon and oxygen, whereby the variable resistance layer 117 is formed above the second electrode 116 and the interlayer insulating layer 114. It is to be noted that in the first embodiment, the variable resistance layer (tantalum oxide layer) 117 has an oxygen content atomic percentage no less than 45 atm % and no more than 65 atm %.

Figure 4F:
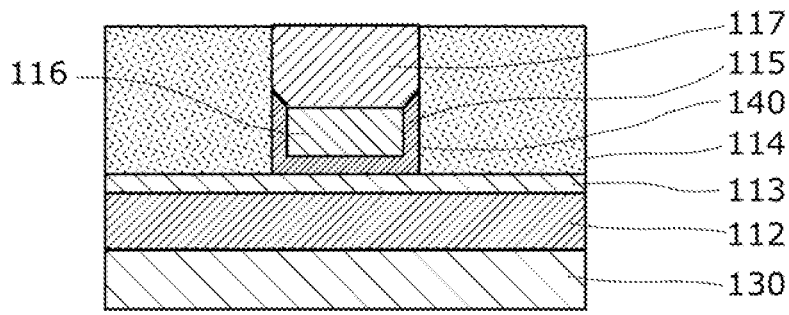
FIG. 4F is a cross-sectional view showing a manufacturing process of a main component (the first variable resistance layer planarization process) of the nonvolatile memory device according to the first embodiment of the present invention.

Afterward, as shown in FIG. 4F, a planarization process by CMP is performed, removing a portion of the variable resistance layer (tantalum oxide layer) 117 until the interlayer insulating layer 114 is exposed.

Figure 4G:
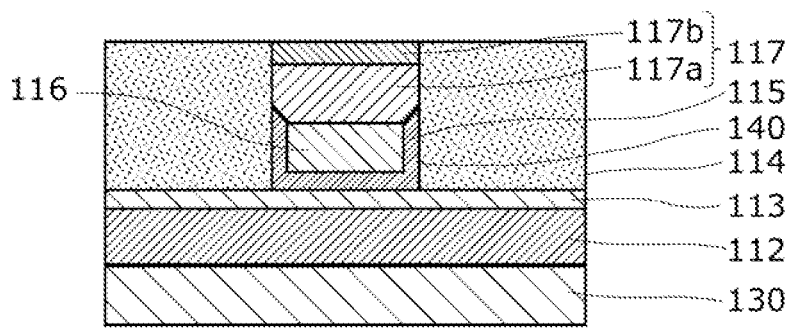
FIG. 4G is a cross-sectional view showing a manufacturing process of a main component (the second variable resistance layer forming process) of the nonvolatile memory device according to the first embodiment of the present invention.

Next, the uppermost surface of the tantalum oxide layer formed as described above is refined by, for example, a plasma oxidation method which oxidizes the surface. Consequently, as shown in FIG. 4G, a region (a second region) is formed on the tantalum oxide layer having an oxygen content atomic percentage that is higher than the oxygen content atomic percentage of the region (a first region) on the tantalum oxide layer that was not oxidized. Here, the first region corresponds to the first variable resistance layer 117a and the second region corresponds to the second variable resistance layer 117b. The variable resistance layer 117 is configured comprising the first variable resistance layer 117a and the second variable resistance layer 117b formed in this manner.

It is to be noted that in the first embodiment, the surface of the variable resistance layer is refined so that the thickness of the second variable resistance layer 117b will be approximately 5 nm. When the variable resistance layer comprises tantalum oxide, a preferable variable resistance characteristic can be obtained when the second variable resistance layer 117b has a thickness of 1 to 8 nm. Moreover, as previously stated, the variable resistance layer may also comprise hafnium oxide or zirconium oxide. When the variable resistance layer comprises hafnium oxide, a preferable variable resistance characteristic can be obtained when the second variable resistance layer 117b has a thickness of 3 to 4 nm. When the variable resistance layer comprises zirconium oxide, a preferable variable resistance characteristic can be obtained when the second variable resistance layer 117b has a thickness of 1 to 5 nm.

Figure 4H:
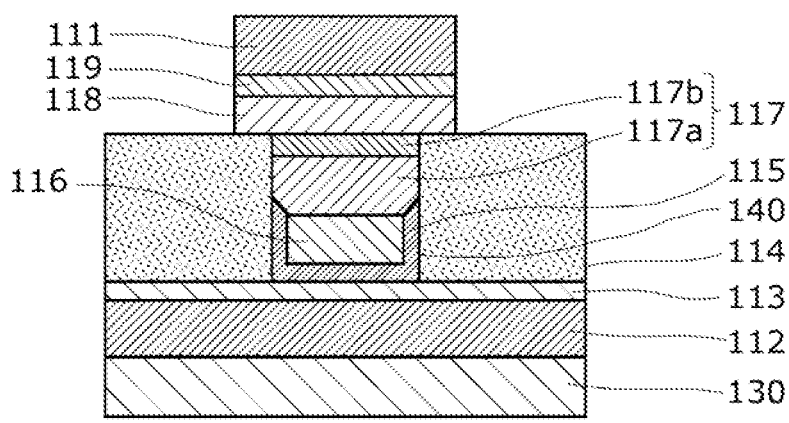
FIG. 4H is a cross-sectional view showing a manufacturing process of a main component (the third electrode forming process, the blocking layer forming process, and the upper line forming process) of the nonvolatile memory device according to the first embodiment of the present invention.

As shown in FIG. 4H, the third electrode 118 comprising platinum, the blocking layer 119 comprising tantalum nitride, and the upper line 111 which is a copper line are formed above the variable resistance layer 117 and the interlayer insulating layer 114 so as to cover the memory cell hole 140 in the interlayer insulating layer 114 by sputtering using a desired mask.

With the first embodiment, as previously stated, because the barrier layer 115 is embedded in the memory cell hole 140 and the second electrode 116 is directly embedded on the barrier layer 115, the barrier layer ($SiN_z$) 115 can be formed without being exposed by an etching process, and as such the film thickness can easily be controlled. Moreover, because the interface between metal and semiconductor, which is especially important in a MSM diode, will not be damaged by an etching process, a preferable interface state can be achieved. Additionally, oxidation of the lower line 112 can be suppressed as a result of the barrier layer 115 and the first electrode 113 functioning as an oxygen blocking layer. Furthermore, because silicon nitride has an adhesion property that is preferable to a silicon oxide film, the barrier layer 115 can also function as an adhesion layer as a result of the barrier layer 115 comprising silicon nitride being formed not only on the bottom portion, but the side walls of the memory cell hole 140 in the interlayer insulating layer 114 made of a silicon oxide film.

Moreover, the embedding process is simplified and a stabilized operation can be realized as a result of the variable resistance layer 117 being similarly embedded in the upper region of the memory cell hole 140. It is to be noted that, in contrast to a configuration in which the diode is provided above the variable resistance layer, providing the variable resistance layer above the diode such as in the first embodiment has the benefit of being able to realize a high resistance layer by oxidizing the upper surface of the variable resistance layer, as well as the benefit of ease of control of the composition of the variable resistance layer.

It is to be noted that in the first embodiment, while a stacked structure including a layer having a low oxygen content atomic percentage and a layer having a high oxygen content atomic percentage was formed by a simple process of oxidizing the uppermost surface of the tantalum oxide layer having a low oxygen content atomic percentage, the present invention is not limited thereto. For example, the stacked structure may be formed by depositing a layer having a high oxygen content atomic percentage on a layer having a low oxygen content atomic percentage.

As described above, with the present invention, memory cell structures which are suitable for miniaturization can be realized with simple processes, and a nonvolatile memory element and a nonvolatile memory device which allow for stable resistance change can be realized.

[Variation of the First Embodiment]

Figure 5:
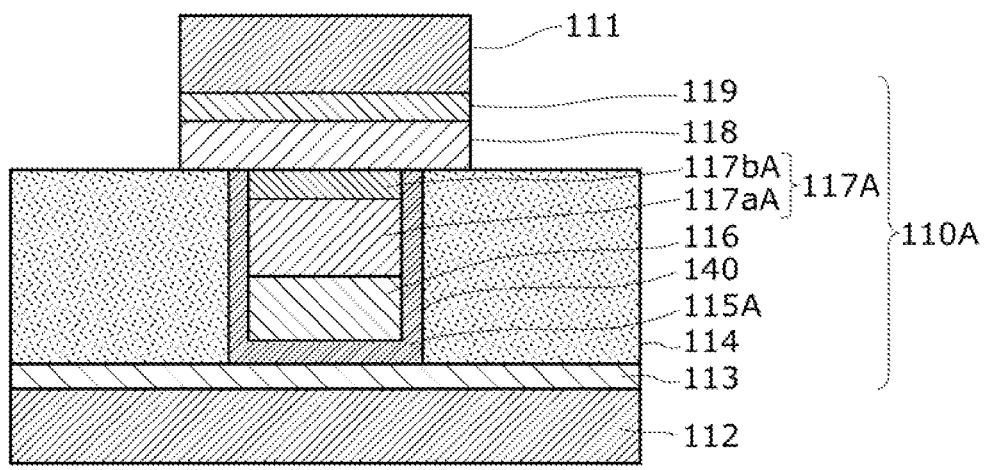
FIG. 5 is a cross-sectional view of the memory cell according to a variation of the first embodiment of the present invention.

Next, the nonvolatile memory device according to the variation of the first embodiment of the present invention will be explained with reference to FIG. 5. FIG. 5 is a cross-sectional view showing a configuration of the memory cell (nonvolatile memory element) included in the nonvolatile memory device according to the variation of the first embodiment of the present invention. Similarly to FIG. 3, FIG. 5 shows the configuration of Part B in FIG. 2.

In the nonvolatile memory element according to the first embodiment of the present invention shown in FIG. 3, the barrier layer 115 is formed on the bottom surface and a portion of the side walls of the memory cell hole 140. However, as is shown in FIG. 5, in a memory cell 110A according to the variation of the first embodiment of the present invention, a barrier layer 115A is formed on the entire bottom surface and the completely covering the walls of the memory cell hole 140. That is, in the variation of the first embodiment, the barrier layer 115A is formed so as to cover the all of the inner surfaces of the memory cell hole 140. Moreover, a first variable resistance layer 117aA and a second variable resistance layer 117bA which constitute a variable resistance layer 117A are embedded in the memory cell hole 140 without being in contact with the interlayer insulating layer 114.

It is to be noted that other configurations in the nonvolatile memory element and the nonvolatile memory device according to the variation of the first embodiment are the same as the first embodiment of the present invention, and as such descriptions thereof will be omitted. Moreover, the nonvolatile memory element according to the variation of the first embodiment can be manufactured using the same method as the first embodiment.

(Second Embodiment)

Figure 6:
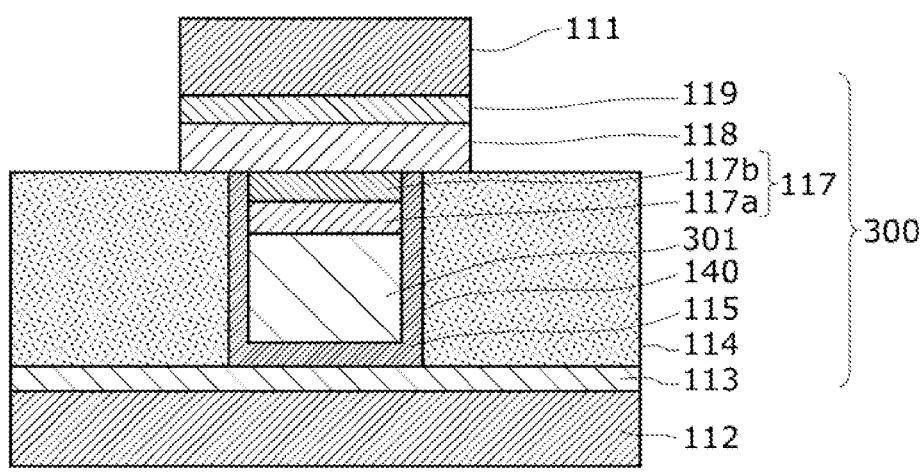
FIG. 6 is a cross-sectional view showing a configuration of a memory cell included in a nonvolatile memory device according to the second embodiment of the present invention.

Next, the nonvolatile memory device according to the second embodiment of the present invention will be explained with reference to FIG. 6. FIG. 6 is a cross-sectional view showing a configuration of the memory cell included in the nonvolatile memory device according to the second embodiment of the present invention. Similarly to FIG. 3, FIG. 6 shows the configuration of Part B in FIG. 2. While the second electrode 116 in the nonvolatile memory element according to the first embodiment of the present invention, as previously stated, comprises tantalum nitride, the material used in the second electrode 116 is not limited to tantalum nitride as in the first embodiment; other materials are acceptable.

In the second embodiment, a memory cell (the nonvolatile memory element) in which α-tungsten (α-W) is used for the second electrode will be described.

As shown in FIG. 6, in a memory cell 300 included in the nonvolatile memory device according to the second embodiment, the memory cell hole 140 in which the interlayer insulating layer 114 is embedded is filled with the barrier layer 115, a second electrode 301, and the variable resistance layer 117. Here, the second electrode 301 comprises α-tungsten.

The α-tungsten used in the second embodiment can be formed by chemical vapor deposition (CVD), meaning it is characteristically superior for embedding. Therefore, in contrast to the second electrode 116 comprising tantalum nitride in the first embodiment, there is an advantage with the memory cell 300 according to the second embodiment in which the second electrode 301 can easily be embedded in the memory cell hole 140. Moreover, an advantage of the second embodiment is that this process is satisfactorily compatible with current semiconductor manufacturing processes.

It is to be noted that other configurations in the nonvolatile memory element and the nonvolatile memory device, as well as the method of manufacturing according to the second embodiment are the same as the first embodiment of the present invention, and as such descriptions thereof will be omitted.

(Third Embodiment)

Figure 7:
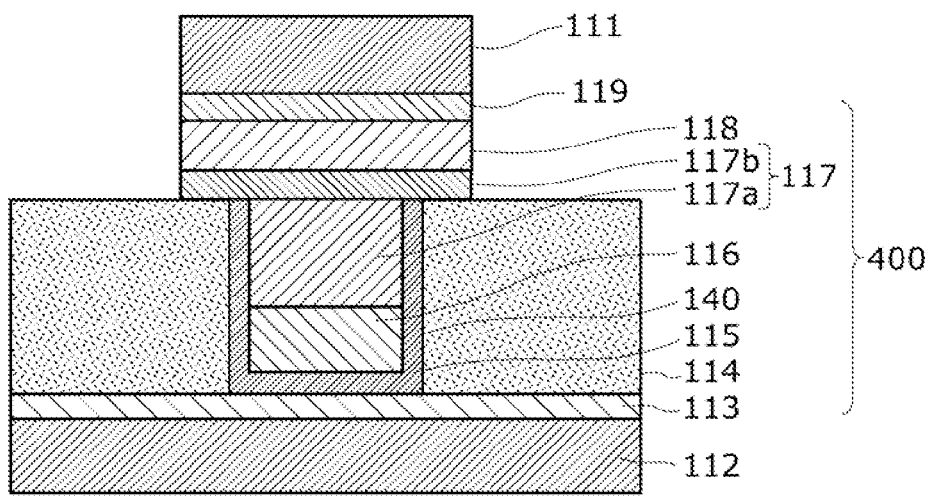
FIG. 7 is a cross-sectional view showing a configuration of a memory cell included in a nonvolatile memory device according to the third embodiment of the present invention.

Next, the third embodiment of the present invention will be explained with reference to FIG. 7. FIG. 7 is a cross-sectional view showing a configuration of the memory cell included in the nonvolatile memory device according to the third embodiment of the present invention.

In the nonvolatile memory element according to the first embodiment of the present invention showed in FIG. 3, the first variable resistance layer 117a and the second variable resistance layer 117b which constitute the variable resistance layer 117 are embedded in the memory cell hole 140 formed in the interlayer insulating layer 114. In contrast, a memory cell 400 included in the nonvolatile memory device according to the third embodiment of the present invention is different from the structure of the first embodiment in that the second variable resistance layer 117b is formed outside of the memory cell hole.

As shown in FIG. 7, in the memory cell 400 included in the nonvolatile memory device according to the third embodiment of the present invention, the second variable resistance layer 117b included in the variable resistance layer 117 is formed on the interlayer insulating layer 114 so as to cover the memory cell hole 140 formed in the interlayer insulating layer 114. It is to be noted that the first variable resistance layer 117a is embedded in the memory cell hole 140. Thus, in the third embodiment, the second variable resistance layer 117b is formed to extend over (i) the first variable resistance layer 117a embedded in the memory cell hole 140 and (ii) the interlayer insulating layer 114.

Also, provided above the second variable resistance layer 117b is the third electrode 118 comprising platinum, the blocking layer 119, and the upper line 111. The third electrode 118 and the blocking layer 119 constitute the upper electrode.

It is to be noted that other configurations in the nonvolatile memory element and the nonvolatile memory device, as well as the method of manufacturing according to the third embodiment are the same as the first embodiment of the present invention, and as such descriptions thereof will be omitted.

In the third embodiment, the second variable resistance layer 117b is formed by being deposited on the interlayer insulating layer 114 via sputtering using a desired mask. As a result, uniformity in film thickness of the second variable resistance layer 117b can be improved.

Moreover, in the third embodiment, by providing at least a portion of the second variable resistance layer 117b in between the interlayer insulating layer 114 and the third electrode 118, direct contact of the silicon oxide layer (the interlayer insulating layer 114) which has poor adhesiveness and platinum (the third electrode 118) can be avoided, thus increasing the adhesiveness thereof. That is, in the third embodiment, the second variable resistance layer 117b can be used as an adhesion layer.

It is to be noted that other configurations in the nonvolatile memory element and the nonvolatile memory device, as well as the method of manufacturing according to the third embodiment are the same as the first embodiment of the present invention, and as such descriptions thereof will be omitted.

(Fourth Embodiment)

Figure 8:
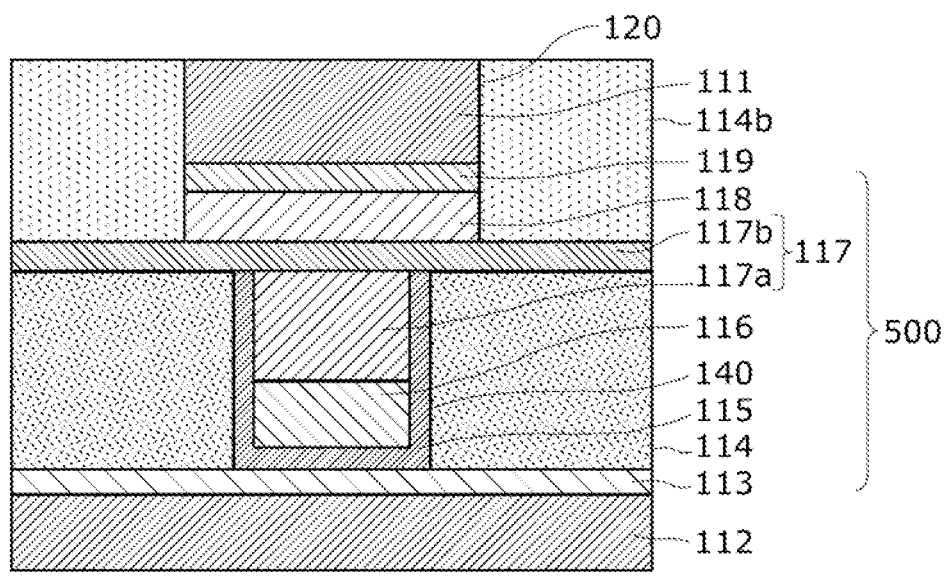
FIG. 8 is a cross-sectional view showing a configuration of a memory cell included in a nonvolatile memory device according to the fourth embodiment of the present invention.

Next, the fourth embodiment of the present invention will be explained with reference to FIG. 8. FIG. 8 is a cross-sectional view showing a configuration of the memory cell included in the nonvolatile memory device according to the fourth embodiment of the present invention.

Similarly to the memory cell 400 according to the third embodiment of the present invention shown in FIG. 7, in a memory cell 500 according to the fourth embodiment of the present invention, the second variable resistance layer 117b is formed outside the memory cell hole 140 which is formed in the interlayer insulating layer 114. However, in the third embodiment, as is shown in FIG. 7, the second variable resistance layer 117b is formed only on a portion of the interlayer insulating layer 114, while in the fourth embodiment, as is shown in FIG. 8, the second variable resistance layer 117b is formed on the entire top surface of the interlayer insulating layer 114. Thus, in the fourth embodiment, the second variable resistance layer 117b is formed on the entire top surface of the interlayer insulating layer 114 by a sputtering method so as to cover the first variable resistance layer 117a which is embedded in the memory cell hole 140.

Also, further formed on the second variable resistance layer 117b is an interlayer insulating layer 114b wherein a trench 120 is formed in a line shape. Formed inside the trench 120 above the second variable resistance layer 117b are the third electrode 118, the blocking layer 119, and the upper line 111. The third electrode 118 and the blocking layer 119 constitute the upper electrode. Thus, in the fourth embodiment, the second variable resistance layer 117b is configured to be deposited between the lower the interlayer insulating layer 114 and the upper the interlayer insulating layer 114b.

It is to be noted that other configurations in the nonvolatile memory element and the nonvolatile memory device, as well as the method of manufacturing according to the fourth embodiment are the same as the third embodiment of the present invention, and as such descriptions thereof will be omitted.

Similar to the third embodiment, the fourth embodiment is effective in that uniformity in film thickness of the second variable resistance layer 117b can be improved and the second variable resistance layer 117b can. function as an adhesion layer.

(Fifth Embodiment)

Figure 9:
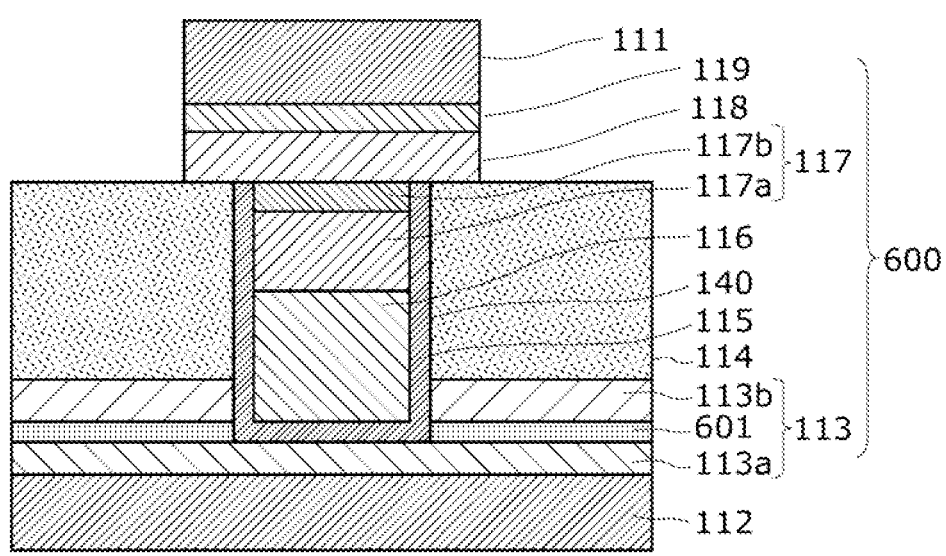
FIG. 9 is a cross-sectional view showing a configuration of a memory cell included in a nonvolatile memory device according to the fifth embodiment of the present invention.

Next, the fifth embodiment of the present invention will be explained with reference to FIG. 9. FIG. 9 is a cross-sectional view showing a configuration of the memory cell included in the nonvolatile memory device according to the fifth embodiment of the present invention.

As shown in FIG. 9, in a memory cell 600 included in the nonvolatile memory device according to the fifth embodiment of the present invention, the memory cell hole 140 is formed penetrating through the interlayer insulating layer 114 and extending inside the first electrode 113.

Specifically, in the fifth embodiment, the first electrode 113 has a stacked structure including a first tantalum nitride layer 113a and a second tantalum nitride layer 113b. Furthermore, an etch stop layer 601 comprising platinum (Pt) is formed between the first tantalum nitride layer 113a and the second tantalum nitride layer 113b. The etch stop layer 601 functions as an etch stop layer for when the memory cell hole 140 is formed by etching.

That is, in the fifth embodiment, when forming the memory cell hole 140 in the interlayer insulating layer 114, after the interlayer insulating layer 114 is etched by dry etching using a fluorine-based etching gas, the second tantalum nitride layer 113b is etched by dry etching using a chlorine-based etching gas until the etch stop layer 601 is reached. Next, the etch stop layer 601 on the bottom portion of the memory cell hole 140 is completely removed by sputter etching using Ar gas, whereby the first tantalum nitride layer 113a is exposed.

Consequently, the first electrode 113 comprising tantalum nitride is exposed not only to the bottom surface but to the side walls of the memory cell hole 140 as well.

Then, the barrier layer 115, the second electrode 116, and the variable resistance layer 117 are sequentially embedded in the memory cell hole 140 which is formed in this manner.

It is to be noted that other configurations in the nonvolatile memory element and the nonvolatile memory device, as well as the method of manufacturing according to the fifth embodiment are the same as the third embodiment of the present invention, and as such descriptions thereof will be omitted.

With the configuration as described above, the barrier layer 115 is in contact with the first tantalum nitride layer 113a on the bottom surface of the memory cell hole 140 and with the second tantalum nitride layer 113b on a portion of the side walls of the memory cell hole 140. Thus, the region of the barrier layer 115 and the first electrode 113 that is in contact (the first tantalum nitride layer 113a+the etch stop layer 601+ the second tantalum nitride layer 113b) can be increased, thereby increasing an affective diode area, and achieving high-current capability.

(Sixth Embodiment)

Figure 10:
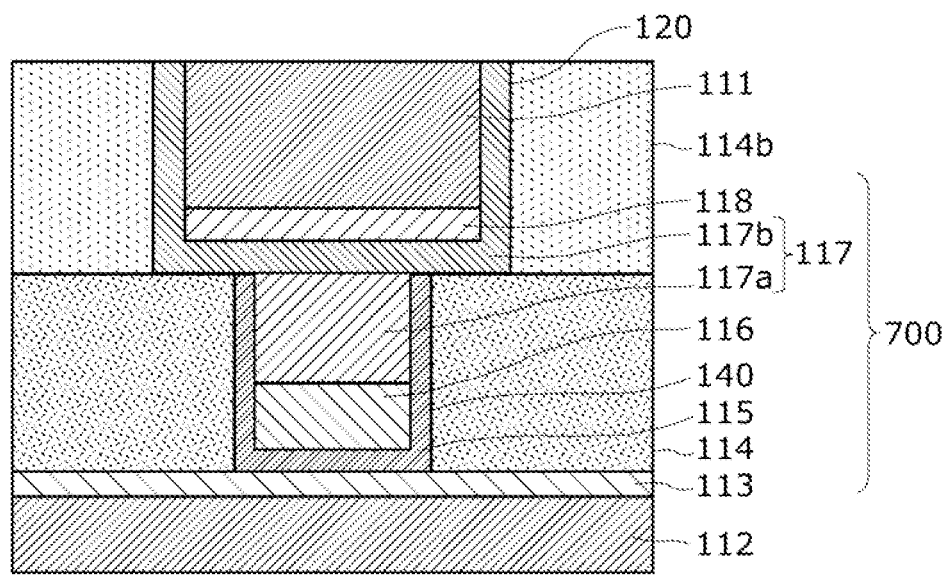
FIG. 10 is a cross-sectional view showing a configuration of a memory cell included in a nonvolatile memory device according to the sixth embodiment of the present invention.
Figure 11A:
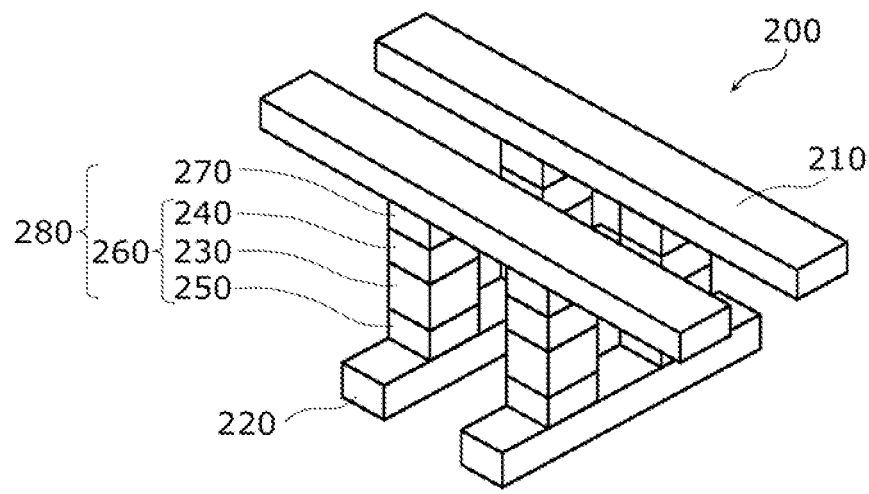
FIG. 11A is a perspective view showing a configuration of the conventional nonvolatile memory device.
Figure 11B:
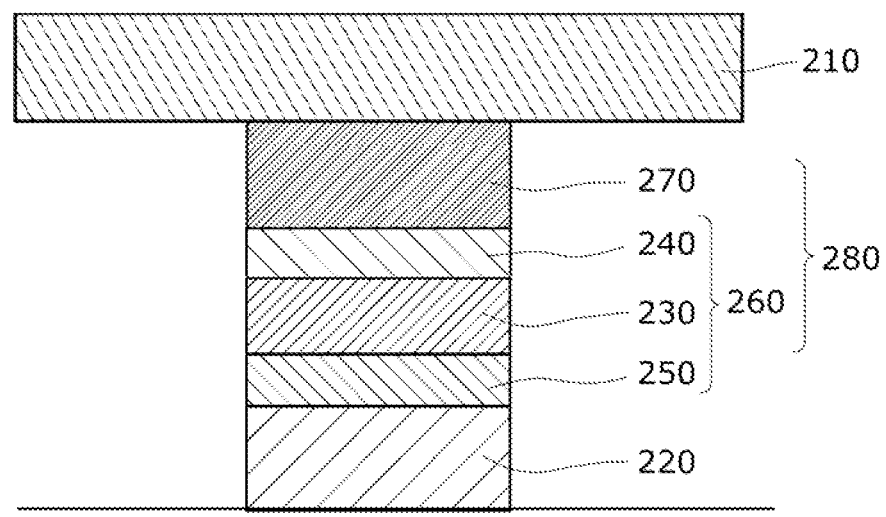
FIG. 11B is a cross-sectional view showing a configuration of a memory cell included in the conventional nonvolatile memory device.

Next, the sixth embodiment of the present invention will be explained with reference to FIG. 10. FIG. 10 is a cross-sectional view showing a configuration of the memory cell included in the nonvolatile memory device according to the sixth embodiment of the present invention.

As shown in FIG. 10, in the memory cell 700 included in the nonvolatile memory device according to the sixth embodiment of the present invention, similarly to the third and fourth embodiments, the second variable resistance layer 117b is formed outside the memory cell hole 140. The difference between the sixth embodiment and the third and fourth embodiments is in the formation area and formation method of the second variable resistance layer 117b.

To explain it in more detail, in the sixth embodiment, the second variable resistance layer 117b is formed on the bottom portion and side walls of the line-shaped the trench 120 formed in the interlayer insulating layer 114b, which is formed to cover the memory cell hole 140 in the interlayer insulating layer 114a. In other words, the trench 120 is formed perpendicular to the lower line 112 in FIG. 10, that is, formed continuously in the direction that the upper line 111 is arranged in. It is to be noted that, the trench 120 formed in the interlayer insulating layer 114b is formed so that the width thereof is larger than the diameter of the memory cell hole 140, and so that at least a portion of the second variable resistance layer 117b on the bottom portion of the trench 120 is positioned between the interlayer insulating layer 114a and the third electrode 118. Moreover, the third electrode 118 made of platinum (Pt) is formed on the second variable resistance layer 117b in the bottom portion of the trench 120 in the interlayer insulating layer 114b, and the upper line 111, which is a copper line, is formed on the third electrode 118.

The memory cell 700 according to the sixth embodiment can be manufactured as follows.

First, as is shown in FIG. 4, after the predetermined material (the barrier layer 115, the second electrode 116, and the first variable resistance layer 117a) is embedded in the memory cell hole 140, CMP is performed removing a portion of the first variable resistance layer 117a until the interlayer insulating layer 114 is exposed. It is to be noted that in FIG. 4F the barrier layer 115 is only formed on the bottom surface and a portion of the side walls of the memory cell hole 140, but after depositing the barrier layer 115 on the bottom surface and covering all of the side walls, the predetermined materials described above may be embedded in the memory cell hole 140.

Next, the interlayer insulating layer 114b is formed on the interlayer insulating layer 114a so as to cover the memory cell hole 140. Then, the trench 120 that penetrates through the interlayer insulating layer 114b and connects to the first variable resistance layer 117a is formed.

Next, the second variable resistance layer 117b is formed on the bottom portion and side walls of the trench 120 in the interlayer insulating layer 114b. Then, the third electrode 118 comprising platinum is formed on the second variable resistance layer 117b formed on the bottom portion of the trench 120, and the upper line 111, which is a copper line, is formed in a damascene process.

It is to be noted that other configurations in the nonvolatile memory element and the nonvolatile memory device, as well as the method of manufacturing according to the fifth embodiment are the same as the third embodiment of the present invention, and as such descriptions thereof will be omitted.

As previously described, when the sixth embodiment is used, there is an advantage in that compatibility with the Cu damascene process can be ensured. Moreover, there is an advantage in that the second Variable resistance layer 117b can be used as a diffusion prevention layer to prevent the diffusion of Cu.

(Other Embodiments)

Hereinbefore, the nonvolatile memory element, the nonvolatile memory device, and the method of manufacturing the nonvolatile memory element according to the present invention were described based on each of the embodiments. However, the present invention is not limited these embodiments.

For example, in each of the above mentioned embodiments, the variable resistance layer comprised tantalum oxide, but the present invention is not limited thereto. The variable resistance layer may comprise, for example, hafnium (Hf) oxide, or zirconium (Zr) oxide.

When the variable resistance element having a stacked structure comprising hafnium oxide is used, it is preferable that a first hafnium oxide have a composition that approximately satisfies $0.9 \leq x \leq 1.6$ when expressed as $HfO_x$, and a second hafnium oxide have a composition that approximately satisfies $1.8 < y < 2.0$ when expressed as $HfO_y$. It is preferable that a film thickness of the second hafnium oxide be no less than 3 nm and no more than 4 nm.

Similarly, when a stacked structure comprising zirconium oxide is used, it is preferable that a first zirconium oxide have a composition that approximately satisfies $0.9 \leq x \leq 1.4$ when expressed as $ZrO_x$, and a second zirconium oxide have a composition that approximately satisfies $1.9 < y < 2.0$ when expressed as $ZrO_y$. It is preferable that a film thickness of the second zirconium oxide be no less than 1 nm and no more than 5 nm.

Moreover, in the embodiments described above, the second electrode 116 and the third electrode 118 were described as, but are not limited to, comprising tantalum nitride (TaN) and platinum (Pt), respectively. A material may be used which satisfies the relationships V2>Vt and V2>V1 when the standard electrode potential of the second electrode is V1, the standard electrode potential of the third electrode is V2, and the standard electrode potential of the transition metal included in the variable resistance layer is Vt.

Specifically, when the variable resistance film comprises tantalum oxide and the second electrode comprises at least one of tantalum nitride (TaN), tungsten (W), nickel (Ni), tantalum (Ta), titanium (Ti), and aluminum (Al), the third electrode may comprise, as a material having a standard electrode potential that is higher than the standard electrode potential of the tantalum oxide, one or a combination of platinum, (Pt), iridium (Ir), palladium (Pd), silver (Ag), and copper (Cu). Moreover, when the second electrode comprises at least one of Ta, Ti, and Al, the third electrode may comprise one or a combination of Pt, Ir, Pd, Ag, Cu, W, Ni, and TaN. On the other hand, when the variable resistance film comprises hafnium oxide and the second electrode comprises at least one of Al, Ti, and hafnium (Hf), the third electrode may comprise, as a material having a standard electrode potential that is higher than the standard electrode potential of the hafnium oxide, one or a combination of Pt, Ir, Pd, Ag, and Cu and such. It is further preferable that the second electrode comprises Tan or W, and the third electrode comprises one of Pt, Ir, and Pd. When this is the case, a range in variation of resistance one order of magnitude and greater can be achieved, and a reliable and preferable variable resistance element can be formed.

Moreover, in this embodiment, the variable resistance layer 117 has, but is not limited to, a two layered stacked structure of a first variable resistance layer 117a and a second variable resistance layer 117b. The variable resistance layer 117 may, for example, have a stacked structure of three or more layers. For example, a tantalum oxide layer or a layer comprising a different transition metal oxide may be formed as a third variable resistance layer.

The present invention also includes variations of the present invention conceived by those skilled in the art unless they depart from the spirit and scope of the present invention. Furthermore, respective constituent elements of different exemplary embodiments may be arbitrarily combined within the scope of the essence of the present invention.

INDUSTRIAL APPLICABILITY

The present invention is useful as a nonvolatile memory element and a nonvolatile memory device which can be used in a variety of electronic equipment such as personal computers or cellular phones, as well as a method of manufacturing the nonvolatile memory element.

REFERENCE SIGNS LIST 100 nonvolatile memory device
101 memory main body
102, 200 memory cell array
103 row selection circuit (driver)
104 column selection circuit (driver)
105 write circuit
106 sense amplifier
107 data input and output circuit
108 address input circuit
109 control circuit
110, 110A, 280, 300, 400, 500, 600, 700 memory cell
111 upper line
112 lower line
113 first electrode
113a first tantalum nitride layer
113b second tantalum nitride layer
114, 114a, 114b interlayer insulating layer
115, 115A barrier layer
116, 301 second electrode
117, 117A, 230 variable resistance layer
117a, 117aA first variable resistance layer
117b, 117bA second variable resistance layer
118 third electrode
119 blocking layer
120 trench
130 substrate
140 memory cell hole
210, bl0, bl1, bl2 bit line
220, WL0, WL1, WL2 word line
240 upper electrode
250 lower electrode
260 variable resistance element
270 nonlinear element
601 etch stop layer
M111, M112, M113, M121, M122, MC123, M131, M132, M133 memory cell

The invention claimed is:

1. A nonvolatile memory element comprising:
a lower line formed above a substrate;
a first electrode formed on said lower line;
an interlayer insulating layer formed on said first electrode and provided with a memory cell hole that reaches a portion of said first electrode;
a barrier layer formed in a recessed shape to cover a bottom surface and at least a portion of a side wall inside said memory cell hole and connected to said first electrode, said barrier layer being a semiconductor layer or an insulating layer;
a second electrode formed inside said memory cell hole and connected to both a portion of said barrier layer formed on the side wall and a portion of said barrier layer formed on the bottom surface;
a variable resistance layer formed on said second electrode and having a stacked structure including a first oxide layer and a second oxide layer having an oxygen content atomic percentage that is higher than an oxygen content atomic percentage of said first oxide layer; and
a third electrode formed on said interlayer insulating layer and connected to said variable resistance layer,
wherein a resistance state of said variable resistance layer changes to a different resistance state based on an electric signal applied between said second electrode and said third electrode,
said barrier layer forms a Schottky barrier junction with at least one of said first electrode and said second electrode, and
said first electrode is formed lower than a bottom plane of said memory cell hole and on an entire top surface of said lower line.

2. The nonvolatile memory element according to claim 1, wherein said variable resistance layer comprises tantalum oxide or hafnium oxide.

3. The nonvolatile memory element according to claim 1, wherein at least a portion of said variable resistance layer is formed inside said memory cell hole.

4. The nonvolatile memory element according to claim 3, wherein said first oxide layer is formed inside said memory cell hole.

5. The nonvolatile memory element according to claim 4, wherein said second oxide layer is formed outside said memory cell hole.

6. The nonvolatile memory element according to claim 1, wherein said first oxide layer comprises tantalum oxide having a composition expressed as TaOx (where $0.8 \leq x \leq 1.9$), and
said second oxide layer comprises tantalum oxide having a composition expressed as TaOy (where $2.1 \leq y$).

7. The nonvolatile memory element according to claim 1, wherein the semiconductor layer is a silicon nitride layer.

8. The nonvolatile memory element according to claim 1, wherein said second electrode comprises tantalum nitride or tungsten.

9. The nonvolatile memory element according to claim 1, wherein said memory cell hole is formed penetrating through said interlayer insulating layer to inside of said first electrode.

10. The nonvolatile memory element according to claim 1, wherein said third electrode is formed outside said memory cell hole.

11. A nonvolatile memory device provided with said nonvolatile memory element according to claim 1, said nonvolatile memory device comprising:
   a plurality of first electrode lines formed parallel to each other above the substrate;
   a plurality of second electrode lines formed above said first electrode lines so as to (i) be parallel to each other in a plane parallel with a major surface of the substrate and (ii) three-dimensionally cross said first electrode lines; and
   a plurality of said nonvolatile memory elements provided at positions which correspond to the three-dimensional crosspoints of said first electrode lines and said second electrode lines.

12. The nonvolatile memory element according to claim 1, wherein said second electrode is formed in a recessed portion of said barrier layer formed in the recessed shape.

* * * * *